(12) United States Patent
Liu et al.

(10) Patent No.: US 9,142,422 B2
(45) Date of Patent: Sep. 22, 2015

(54) METHODS OF FABRICATING DEFECT-FREE SEMICONDUCTOR STRUCTURES

(71) Applicant: GLOBALFOUNDRIES Inc., Grand Cayman (KY)

(72) Inventors: Hung-Wei Liu, Saratoga Springs, NY (US); Zhiguo Sun, Halfmoon, NY (US); Huang Liu, Mechanicville, NY (US); Jin Ping Liu, Ballston Lake, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 64 days.

(21) Appl. No.: 14/070,823

(22) Filed: Nov. 4, 2013

(65) Prior Publication Data
US 2015/0123250 A1 May 7, 2015

(51) Int. Cl.
*H01L 21/311* (2006.01)
*H01L 23/58* (2006.01)

(52) U.S. Cl.
CPC .......... *H01L 21/31111* (2013.01); *H01L 23/58* (2013.01)

(58) Field of Classification Search
CPC ..................... H01L 21/3116; H01L 21/76819; H01L 21/316
USPC .......... 427/569, 579, 534; 438/695, 697, 712, 438/723, 638; 257/632
See application file for complete search history.

(56) References Cited

U.S. PATENT DOCUMENTS

| | | | | |
|---|---|---|---|---|
| 5,902,127 A * | 5/1999 | Park | ............................. | 438/435 |
| 6,218,268 B1 * | 4/2001 | Xia et al. | ..................... | 438/435 |
| 6,348,706 B1 * | 2/2002 | Sandhu | ........................ | 257/296 |
| 6,444,136 B1 * | 9/2002 | Liu et al. | ......................... | 216/62 |
| 6,444,593 B1 * | 9/2002 | Ngo et al. | ..................... | 438/788 |
| 7,001,854 B1 * | 2/2006 | Papasouliotis et al. | ....... | 438/788 |
| 7,598,174 B1 * | 10/2009 | Zhuang | ........................ | 438/689 |
| 7,972,968 B2 * | 7/2011 | Lee et al. | ..................... | 438/711 |
| 8,497,211 B2 * | 7/2013 | Lee et al. | ..................... | 438/694 |
| 8,916,429 B2 * | 12/2014 | Chou et al. | .................... | 438/197 |

* cited by examiner

*Primary Examiner* — Thao P Le
(74) *Attorney, Agent, or Firm* — Heslin Rothenberg Farley & Mesiti P.C.; Nicholas Mesiti, Esq.

(57) ABSTRACT

Methods of facilitating fabrication of defect-free semiconductor structures are provided which include, for instance: providing a dielectric layer, the dielectric layer comprising at least one consumable material; selectively removing a portion of the dielectric layer, wherein the selectively removing consumes, in part, a remaining portion of the at least one consumable material, leaving, within the remaining portion of the dielectric layer, a depleted region; and subjecting the depleted region of the dielectric layer to a treatment process, to restore the depleted region with at least one replacement consumable material, thereby facilitating fabrication of a defect-free semiconductor structure.

13 Claims, 3 Drawing Sheets

METHODS OF FABRICATING DEFECT-FREE SEMICONDUCTOR STRUCTURES

FIELD OF THE INVENTION

The present invention relates to structures and methods of facilitating fabricating semiconductor structures, and more particularly, to structures and methods of fabricating defect-free semiconductor structure, for use, in fabrication of integrated circuits.

BACKGROUND OF THE INVENTION

A semiconductor device fabrication, such as transistor fabrication, typically involves deposition of dielectric layers within high aspect ratio openings, associated with various circuit features, for instance, intermetal dielectric (IMD) features, pre-metal dielectric (PMD) features or isolation features, including shallow trench isolation regions. As the size of technology nodes continues to decrease, significant challenges continues to arise due, in part, to limitations of available fabrication techniques, including issues related to planarity and defects within the dielectric layers.

BRIEF SUMMARY

The shortcomings of the prior art are overcome and additional advantages are provided through the provision, in one aspect, of a method which includes, for instance: providing a dielectric layer, the dielectric layer including at least one consumable material; selectively removing a portion of the dielectric layer, wherein the selectively removing consumes, in part, a remaining portion of the at least one consumable material, leaving, within the remaining portion of the dielectric layer, a depleted region; and subjecting the depleted region of the dielectric layer to a treatment process, to restore the depleted region with at least one replacement consumable material, thereby facilitating fabrication of a defect-free semiconductor structure.

In a further aspect, a semiconductor structure is provided which includes: an interlayer structure, the interlayer structure including: at least one first dielectric layer disposed above a semiconductor substrate, one first dielectric layer of the at least one first dielectric layer having a first elemental composition, wherein the first elemental composition includes at least one replacement consumable material; and a second dielectric layer disposed above the at least one first dielectric layer, the second dielectric layer having a second elemental composition, wherein the second elemental composition includes at least one consumable material.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
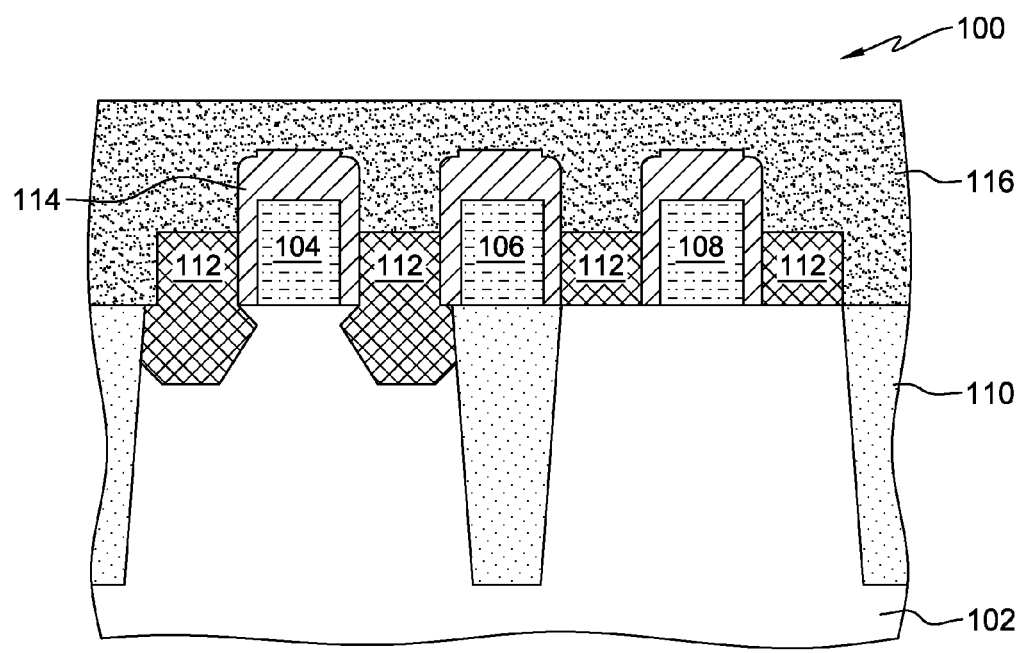
FIG. 1 is a cross-sectional elevational view of one embodiment of an intermediate semiconductor structure, which includes a dielectric layer disposed over semiconductor substrate, and is obtained during semiconductor fabrication process, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

One aspect of integrated circuit fabrication (also referred to as herein semiconductor device fabrication) typically involves deposition of dielectric layer within high aspect ratio openings, associated with various circuit features, for instance, intermetal dielectric (IMD) features, pre-metal dielectric (PMD) features or isolation features, including shallow trench isolation regions. In one example, dielectric layers may include doped or undoped silicon-based high aspect ratio oxides such as, for instance, High-Density-Plasma silicon dioxide (HDP-$SiO_2$), High Aspect Ratio Process (HARP) oxide or ozone-tetraethylorthosilicate ($O_3$-TEOS) oxide.

By way of example, in a conventional semiconductor device fabrication, dielectric layer including, for instance, doped High-Density-Plasma (HDP) silicon dioxide, may generally be deposited using thermal chemical vapor deposition (CVD) or plasma enhanced chemical vapor depostion (PECVD) processes, for instance, by treating an oxygen-containing source such as oxygen ($O_2$) or ozone ($O_3$), with a silicon-containing source. As integration density of transistors continues to increase, the area available for providing a substantially planar, defect-free dielectric layer within the high aspect ratio openings continues to decrease. This decrease in available footprint area within the high aspect ratio openings often results in a multi-step processing technique being employed, in one or more iterations, to provide the dielectric layer. In one example, the multi-step processing technique includes, for instance, deposition, etching and deposition technique (also referred to herein as "dep/etch/dep" processing), wherein a portion of dielectric layer is etched using a suitable etching process, for instance, fluorinebased etching process, followed by deposition of a second layer of dielectric layer. However, this multi-step processing technique will often result in creating defects between the respective dielectric layers, for instance, due to the loss of dopants during the etching processes, thereby resulting in layering (referred to herein as "layering effect") of the respective dielectric layers, and in turn, propagating defects within the semiconductor structure.

Generally stated, disclosed herein, in one aspect, is a method of facilitating fabrication of substantially planar, defect-free semiconductor structure. The method includes: providing a dielectric layer, the dielectric layer comprising at least one consumable material; selectively removing a portion of the dielectric layer, wherein the selectively removing consumes, in part, a remaining portion of the at least one consumable material, leaving, within the remaining portion of the dielectric layer, a depleted region; and subjecting the depleted region of the dielectric layer to a treatment process, to restore the depleted region with at least one replacement consumable material, thereby facilitating fabrication of a defect-free semiconductor structure.

In one embodiment, the dielectric layer includes, for example, a silicon-based high aspect ratio oxide having an initial elemental composition. The silicon-based high aspect ratio oxide having the initial elemental composition may include the at least one consumable material such as, for instance, a doped material. By way of example, the doped material may include at least one of nitrogen and phosphorus. In such a case, the selectively removing consumes, in part, a remaining portion of the at least one consumable material, for instance, a doped material, from within the initial elemental composition of the remaining portion of the dielectric layer, leaving, the depleted region within the remaining portion of the dielectric layer. The subjecting the depleted region further includes restoring the depleted region, for instance, of the remaining portion of the dielectric layer, to the initial elemental composition with the at least one replacement consumable material.

Further, in one embodiment, the remaining portion of the at least one consumable material consumed within the depleted region and the at least one replacement consumable material restored within the depleted region include a same material, for example, nitrogen, phosphorus and undoped silicon.

In one implementation, the treatment process includes facilitating an interaction between the depleted region and at least one source of the at least one replacement consumable material, the interaction restoring the depleted region with the at least one replacement consumable material. The at least one source of the at least one replacement consumable material, for instance, includes at least one of nitrogen source such as, ammonia gas; phosphorus source such as, phosphine gas; and undoped silicon source such as silane gas.

In another implementation, the treatment process includes implanting the depleted region with the at least one replacement consumable material to restore the portion of the consumed at least one consumable material, for instance, the at least one replacement consumable material including at least one of doped material and undoped silicon. By way of example, the doped material includes at least one of nitrogen and phosphorus. Selectively removing the portion of the dielectric layer includes selectively etching the portion of the dielectric layer using nitrogen trifluoride plasma.

In a further embodiment, the method includes repeating sequentially, in at least one or more iterations, the providing a dielectric layer, the selectively removing the portion of the dielectric layer, and the subjecting the depleted region to the treatment process, to achieve the defect-free semiconductor structure. Repeating sequentially further includes providing a plurality of dielectric layer, the providing facilitates minimizing the layering effect between the plurality of dielectric layers, and creating substantially planar, defect-free interlayer structure of the plurality of dielectric layers.

Reference is made below to the drawings, which are not drawn to scale for ease of understanding, wherein the same reference numbers used throughout different figures designate the same or similar components.

By way of example, FIGS. 1-6 depict one detailed embodiment of a method of facilitating fabrication of a defect-free semiconductor structure, for instance, by creating substantially planar, defect-free dielectric layer for use, in fabrication of integrated circuits, in accordance with one or more aspects of the present invention.

FIG. 1 illustrates an intermediate semiconductor structure 100, attained during fabrication of one or more interlayer structures, in accordance with one or more aspects of the present invention. In the example shown, intermediate structure 100 includes a semiconductor substrate 102, such as a bulk semiconductor material, for example, a bulk silicon wafer. In one example, semiconductor substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement (SRI) substrates and the like. Semiconductor substrate 102 may in addition or instead include various isolations, dopings, and/or device features. The semiconductor substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Although not critical to the invention, intermediate semiconductor structure 100 may include a plurality of gate structures 104, 106 and 108, that may be laterally separated by isolation features 110, for instance, shallow trench isolation features (STI). One skilled in the art will know that, the formation of isolation regions, such as, shallow trench isolation may include, for instance, forming a recess within the semiconductor substrate and filling the recess with a dielectric material, for instance, high-density-plasma (HDP) silicon dioxide or TEOS (tetraethylorthosilicate) based silicon oxide, silicon nitride and the like. Although not critical to the invention, gate structures 104, 106 and 108, may include sacrificial gate material, for instance, amorphous-silicon, to hold the gate position for subsequent metal gate structures to be formed.

Although not critical to the invention, intermediate semiconductor structure 100 may further include source and drain regions (also referred to as active region 112) is provided over semiconductor substrate 102. Active region 112 may be formed using any suitable techniques, for instance, ion implantation, epitaxial growth of the embedded source/drain materials and activation anneals.

Intermediate structure 100 may further include a protective hard mask 114, which disposed along the sidewalls and the upper surfaces of respective gate structures 104, 106 and 108. Protective hard mask 114 may be deposited using conventional deposition processes, such as, for example, chemical vapor deposition (CVD), atomic layer deposition (ALD), low-pressure CVD, or plasma-enhanced CVD (PE-CVD). In one example, protective hard mask 114 may have conventional thickness and may include or be fabricated of a material such as, for example, silicon nitride.

A dielectric layer 116 is disposed between and over gate structures 104, 106 and 108, in accordance with one or more aspects of the present invention. Dielectric layer 116 may include or be fabricated of a dielectric material such as, for example, silicon-based high aspect ratio oxide. By way of example, the silicon-based high aspect ratio oxide may include but are not limited to, High-Density-Plasma (HDP) silicon dioxide, high aspect ratio process (HARP) oxide, and may be conformally deposited using conventional deposition processes such as, chemical vapor deposition (CVD), high-density-plasma CVD (HDP-CVD), atomic layer deposition (ALD), physical vapor deposition (PVD) processes and the like.

In accordance with one aspect of the present invention, silicon-based high aspect ratio oxide may include undoped silicon dioxide, with a predetermined initial elemental composition of silicon dioxide ($SiO_2$). In one example, undoped silicon dioxide may be deposited, by employing high-density-plasma CVD (HDP-CVD) process using process gases that include silicon-containing source (e.g., silane ($SiH_4$), disilane ($Si_2H_6$), etc.,), an oxygen-containing source (e.g., oxygen ($O_2$), ozone ($O_3$), etc.,) and an inert gas (e.g., argon (Ar), helium (He), etc.,). In another aspect, silicon-based high aspect ratio oxide may also include doped silicon dioxide, with a predetermined initial elemental composition of stoichiometric silicon dioxide ($SiO_2$) compositions with dopant concentrations in the range of about 0.01 to 10 atomic percent (at. wt. %), the dopants being consumable materials. In one example, the dopants employed may include but are not limited to, n-type dopants. Note that as used herein, n-type dopant refers to the addition of impurities to, for instance, an intrinsic dielectric material/layer, which contribute more electrons to an intrinsic material, and may include (for instance) nitrogen, phosphorus and the like. In one example, nitrogen-doped silicon dioxide or phosphorus-doped silicon dioxide (also referred to herein as phosphorus silica glass (PSG)) may be deposited, by employing high-density-plasma CVD (HDP-CVD) process using process gases that include silicon-containing source (e.g., silane ($SiH_4$), disilane ($Si_2H_6$), etc.,), an oxygen-containing source (e.g., oxygen ($O_2$), ozone ($O_3$), etc.,) and an inert gas (e.g., argon (Ar), helium (He), etc.,) along with suitable dopant precursors such as, for example, ammonia ($NH_3$), phosphine ($PH_3$) respectively. Although the dielectric layer 116 may have conventional suitable thickness, the thickness of dielectric layer 116, in one example, may vary according to the processing node in which the semiconductor device is being fabricated. In one example, the thickness of dielectric layer 116 may be in the range of about 0.1 to 50 nanometers.

Figure 2:
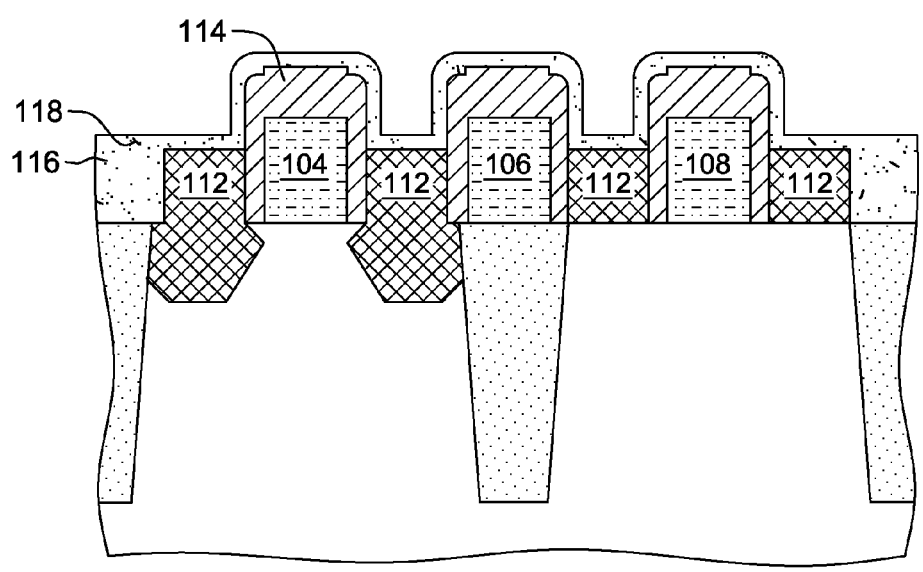
FIG. 2 depicts the semiconductor structure of FIG. 1, after selectively removing a portion of the dielectric layer, leaving, in part, a depleted region, in accordance with one or more aspects of the present invention.

Prior to the present invention, deposition processes employed to provide the dielectric layer between gate structures 104, 106 and 108, as discussed in connection with FIG. 1, disadvantageously often result in a non-uniform deposition of the dielectric layer within the high aspect ratio openings, thereby resulting in voids or defects within the dielectric layer. Consequently, according to the present invention a portion of dielectric layer may be selectively removed, as depicted in FIG. 2, by employing suitable fluorine-containing etching chemistries. One suitable example of fluorine-containing etchants include nitrogen trifluoride ($NF_3$). In one example, a controlled etching process may be employed using nitrogen trifluoride ($NF_3$) as a process gas, at a flow rate of about 100 sccm to about 1000 sccm and at temperature ranging from about 300° C. to about 500° C. This controlled etching process results in removing a portion of dielectric layer, leaving a remaining portion of dielectric layer 116, between respective gate structures 104, 106 and 108. Note that, however, this controlled etching process disadvantageously results in consuming, at least in part, a remaining portion of consumable material, for example, a portion of the dopant present within the predetermined initial elemental composition (for instance, stoichiometric silicon dioxide ($SiO_2$) compositions having dopant concentrations), of the remaining portion of dielectric layer 116. This consumption of a portion of the consumable material results in depleted region 118, within the remaining portion of dielectric layer 116, the depleted region having a loss of, at least a portion of, dopants. In one example, the portion of dopant, for example, nitrogen or phosphorus, consumed within depleted region 118 of the remaining portion of dielectric layer 116 results in the loss of dopant in the range of about 0.01 to 5 atomic percent % (at. wt. %). As understood, "controlled" in this context means that the conventional process conditions, such as, for instance, flow rate, time, for which the etching process is etched, is typically controlled and limited to the desired portion of the consumable dopant consumed within the depleted region.

Figure 3:
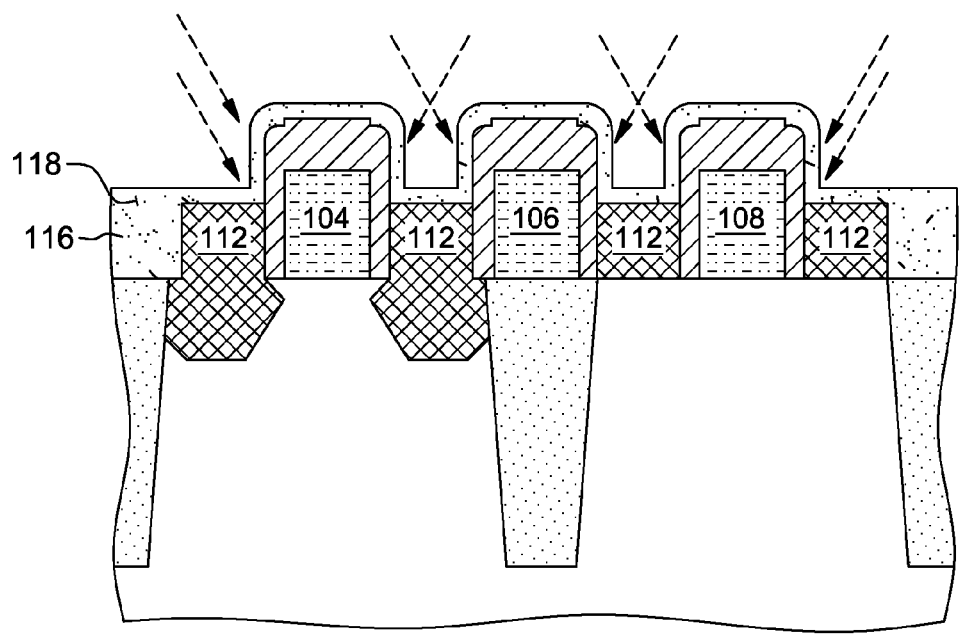
FIG. 3 depicts the semiconductor structure of FIG. 2, after subjecting the depleted region to a treatment process, in accordance with one or more aspects of the present invention.

FIG. 3 depicts the semiconductor structure of FIG. 2 after subjecting depleted region 118 (see FIG. 2) of remaining portion of dielectric layer 116 to a treatment process, in accordance with one or more aspects of the present invention. This treatment process advantageously results in restoring depleted region 118 (see FIG. 2) of the remaining portion of dielectric layer 116, to the same initial elemental composition of the original dielectric layer deposited between gate structures 104, 106 and 108, as discussed above in connection with FIG. 1. Note that depleted region 118 (see FIG. 2) of the remaining portion of dielectric layer 116 may be restored to the same initial elemental composition with a replacement consumable material, for instance, dopants such as, nitrogen or phosphorus. One skilled in the art will note that, the dopant of the replacement consumable material restored within depleted region 118 will be substantially similar to the consumable material, for instance, dopant consumed within the depleted region. In a specific example, if the dopant consumed within depleted region 118 were to be nitrogen, depleted region 118 of the remaining portion of dielectric layer 116 may be subjected to a treatment process using process gas, such as ammonia ($NH_3$). In another specific example, if the dopant consumed within depleted region 118 were to be phosphorus, depleted region 118 of the remaining portion of dielectric layer 116 may be subjected to a treatment process using, for instance, phosphine as a process gas.

By way of an example, the treatment process may be accomplished by facilitating an interaction between depleted region 118 (see FIG. 2) of the remaining portion of dielectric layer 116 and at least one source of the replacement consumable material, for instance, having an n-type dopant such as, nitrogen or phosphorus. An interaction between depleted region 118 (see FIG. 2) and the source of the replacement consumable material may be facilitated using conventional processing techniques, including but are not limited to, ion implantation, chemical reaction and the like., using a plasma processing chamber. In one example, dielectric layer 116, for instance, containing nitrogen-doped silicon dioxide or phosphorus-doped silicon dioxide (also referred to herein as phosphorus silica glass (PSG)) with depleted region 118 (see FIG. 2) having a loss of dopants such as, for example, nitrogen or phosphorus, in the range of about 0.01 to about 5 atomic percent % (at.wt. %), is treated with nitrogen-containing source (e.g., ammonia ($NH_3$)) or phosphorus-containing source (e.g., phosphine ($PH_3$)) respectively, either in presence of or without the presence of undoped silicon-containing source (e.g., silane ($SiH_4$), disilane ($Si_2H_6$), etc..), an oxygen-containing source (e.g., oxygen ($O_2$), ozone ($O_3$), etc.,) and an inert gas (e.g., argon (Ar), helium (He), etc.,) using high-density-plasma CVD (HDP-CVD) process. In an alternate example, dielectric layer 116, for instance, containing nitrogen-doped silicon dioxide or phosphorus-doped silicon dioxide, having a depleted region 118 may be implanted with at least one replacement consumable material, having a dopant such as, nitrogen or phosphorus, either in presence of or without the presence of undoped silicon, to restore the portion of the consumable material consumed within the depleted region of the remaining portion of the dielectric layer.

Figure 4:
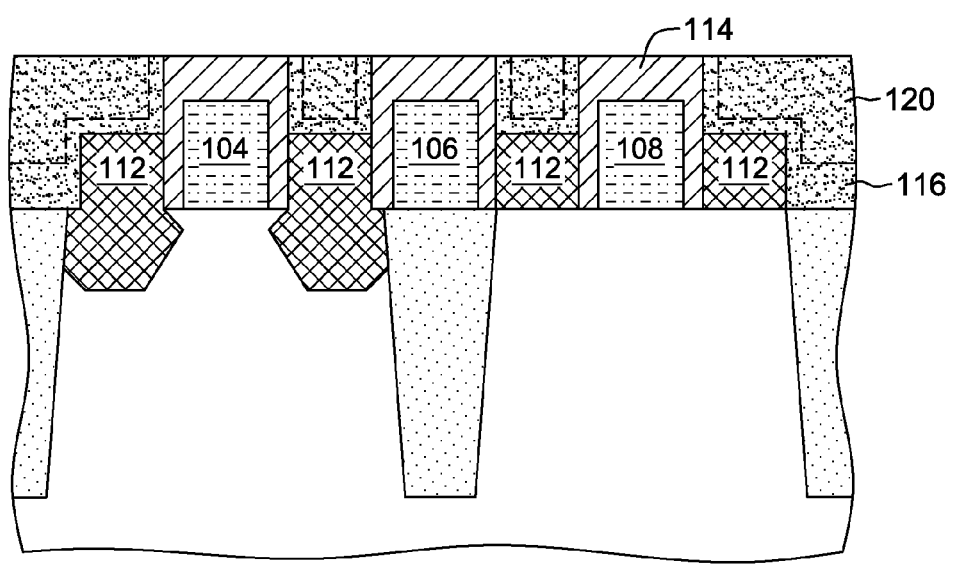
FIG. 4 depicts the intermediate semiconductor structure of FIG. 3, after creating a substantially planar, defect-free semiconductor structure, in accordance with one or more aspects of the present invention.

FIG. 4 depicts the intermediate semiconductor structure of FIG. 3, after repeating the process steps depicted in FIGS. 1-3, sequentially in one or more iterations, as discussed above, in accordance with one or more aspects of the present invention. This sequential repetition of process steps, in the order discussed above, advantageously facilitates in providing a plurality of dielectric layers, for instance, second layer 120 of dielectric layer/material with at least one consumable material such as dopant over a first layer 116 of dielectric layer/material having at least one replacement consumable material. Although not discussed in detail for the sake of brevity, in one specific example, the multi-step processing technique includes, for instance, deposition (step of FIG. 1), etching (step of FIG. 2), treating (step of FIG. 3) and deposition techniques (repeating the step of FIG. 1), the multi-step processing technique also being referred to herein as "dep/etch/treat/dep" processing technique. By way of example, this multi-step processing technique proceeds by providing a dielectric layer, for instance, a silicon-based high aspect ratio oxide having a predetermined initial elemental composition of doped silicon dioxide, with at least one consumable doping material or undoped silicon dioxide over layer of dielectric material/layer 116, having a replacement consumable doping material or replacement consumable undoped material. A portion of second layer 120 of dielectric material/layer may be selectively removed using controlled selective etching process in presence of fluorine-containing etching chemistries, leaving a depleted region within the remaining portion of second layer 120 of dielectric material/layer. The depleted region of second layer of dielectric material/layer is then subjected to a treatment process, for instance, ion implantation, to restore the depleted region of the remaining portion of second layer 120 of dielectric layer to the same initial elemental composition with a replacement consumable doping material. Note that the dielectric layers 116, 120 advantageously facilitate in minimizing the layering effect, that would otherwise be caused, for instance, by the loss of dopants during the etching process, thereby creating a substantially planar, defect-free interlayer structure, for example, of one or more dielectric layers and, in turn, facilitating fabrication of defect-free semiconductor structure.

Figure 5:
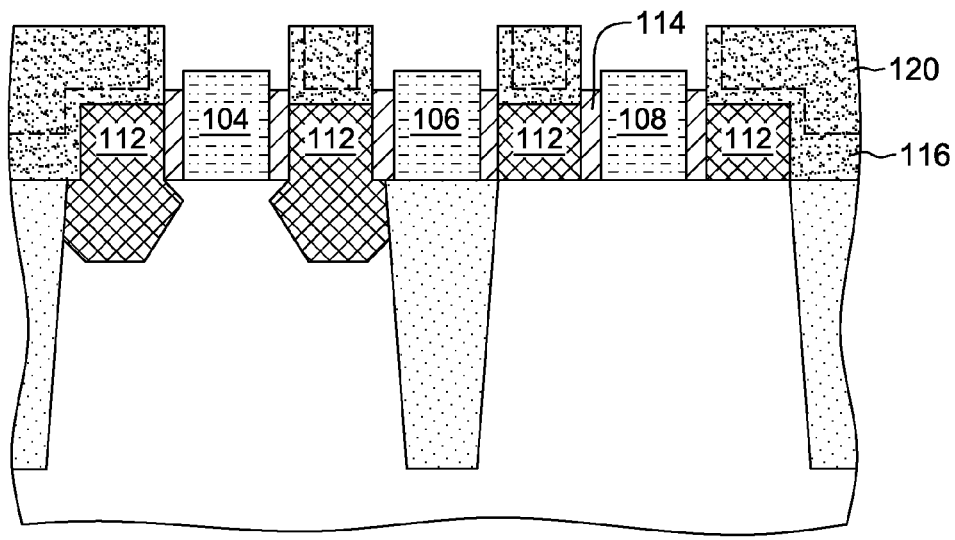
FIG. 5 depicts the intermediate semiconductor structure of FIG. 4, with gate structures having been exposed, in accordance with one or more aspects of the present invention.
Figure 6:
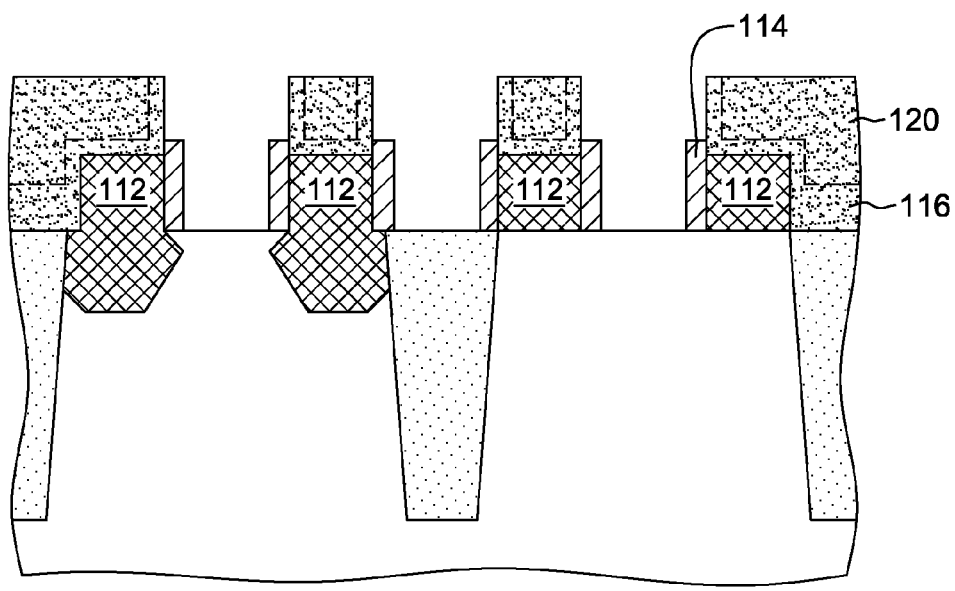
FIG. 6 depicts the intermediate semiconductor structure of FIG. 5 after removal of exposed gate structures, in accordance with one or more aspects of the present invention.

When or after the intermediate semiconductor structure shown in FIG. 4 has been obtained, such structure may be further processed as shown in FIGS. 5 and 6, as further discussed, for example, herein to achieve intermediate semiconductor structure as shown in FIG. 6.

FIG. 5 depicts the structure of FIG. 4 after further processing to recess protective hard masks 114 (see FIG. 4) protecting the underlying gate structures 104, 106 and 108. Any suitable etching process such as, conventional isotropic or anisotropic dry-etching processes such as, reactive ion etching or plasma etching, may be employed resulting in exposing gate structures 104, 106 and 108. In one specific example, reactive ion etching may be performed using remote plasma involving process gases such as nitrogen trifluoride ($NF_3$) and hydrogen ($H_2$). In one example, the protective hard mask may be recessed to a height of about 5 nanometers to about 10 nanometers below the upper surfaces of gate structures 104, 106 and 108.

As illustrated in FIG. 6, the exposed gate structures, holding the gate positions for subsequent metal gate structures to be formed, may selectively be removed using any suitable conventional etching process(es). In one example, the exposed gate structures may be removed using a conventional anisotropic dry etching process or an isotropic wet etching process. In one example, isotropic wet etching may be performed using wet etchants such as, for example, ammonium hydroxide or HF: Nitric acid: Acetic acid solution (also HNA etch). In an alternate example, reactive ion etching or plasma etching may also be employed to remove the exposed adjacent gate structures.

The multi-step processing technique, for instance "dep/etch/treat/dep" technique, described in the present invention facilitates in restoring the depleted region of the dielectric layer to the initial elemental composition with a replacement consumable material such as, for example, nitrogen or phosphorus, resulting in eliminating or minimizing the layering effect, that would otherwise be caused by the loss of consumable doping materials, during the etching process. This elimination or minimization of layering effect of respective dielectric layers, advantageously, results in creating a substantially planar, defect-free interlayer structure, for example, of one or more dielectric layers, which in turn, facilitates in fabricating a defect-free semiconductor structure. The resultant deposited structure minimizes or eliminates distinguishable layers yielding a uniform defect minimized or free semiconductor structure.

Advantageously, the fabrication processing described herein may be employed in providing a defect-free interlayer structure of one or more dielectric layers, within other high aspect ratio openings, associated with various circuit features, for instance, intermetal dielectric (IMD) features, pre-metal dielectric (PMD) features or isolation features, including shallow trench isolation regions, across the semiconductor wafer, and thereby facilitating fabricating a defect-free semiconductor structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a dielectric layer, the dielectric layer comprising at least one consumable material;
   selectively removing a portion of the dielectric layer, wherein the selectively removing consumes, in part, a remaining portion of the at least one consumable material, leaving, within a remaining portion of the dielectric layer, a depleted region; and
   subjecting the depleted region of the dielectric layer to a treatment process, to restore the depleted region with at least one replacement consumable material, thereby facilitating fabrication of a defect-free semiconductor structure,
   wherein the treatment process comprises implanting the depleted region with the at least one replacement consumable material to restore the portion of the consumed at least one consumable material, the at least one replacement consumable material comprising at least one of: (i) doping or dopant material and (ii) undoped silicon.

2. The method of claim 1, wherein the dielectric layer comprises an initial elemental composition, the initial elemental composition comprising the at least one consumable material, wherein the selectively removing consumes, in part, a remaining portion of the at least one consumable material within the initial elemental composition of the remaining portion of the dielectric layer, leaving, the depleted region, and wherein the subjecting the depleted region further comprises restoring the depleted region to the initial elemental composition with the at least one replacement consumable material.

3. The method of claim 2, wherein the dielectric layer further comprises a silicon-based high aspect ratio oxide having an initial elemental composition, the silicon-based high aspect ratio oxide comprising the at least one consumable material, wherein the at least one consumable material further comprising a doping or dopant material.

4. The method of claim 3, wherein the doping or dopant material comprises at least one of: (i) nitrogen and (ii) phosphorus.

5. The method of claim 1, wherein the remaining portion of the at least one consumable material consumed within the depleted region and the at least one replacement consumable material restored within the depleted region comprise a same material.

6. The method of claim 5, wherein the same material comprises at least one of: (i) nitrogen, (ii) phosphorus and (iii) undoped silicon.

7. The method of claim 1, wherein the treatment process comprises facilitating an interaction between the depleted region and at least one source of the at least one replacement consumable material, wherein the interaction restores the depleted region with the at least one replacement consumable material.

8. The method of claim 7, wherein the at least one source of the at least one replacement consumable material comprises at least one of: (i) a nitrogen source, (ii) a phosphorus source and (iii) an undoped silicon source.

9. The method of claim 8, wherein the nitrogen source comprises an ammonia gas, the phosphorus source comprises a phosphine gas, and undoped silicon source comprises a silane gas.

10. The method of claim 1, wherein the doping or dopant material comprises at least one of: (i) nitrogen and (ii) phosphorus.

11. The method of claim 1, wherein the selectively removing the portion of the dielectric layer comprises selectively etching the portion of the dielectric layer using nitrogen trifluoride plasma.

12. The method of claim 1, further comprises:
   repeating sequentially, at least one or more iterations: (i) the providing a dielectric layer, (ii) the selectively removing the portion of the dielectric layer, and (iii) the subjecting the depleted region to the treatment process, to achieve the defect-free semiconductor structure.

13. The method of claim 12, wherein the repeating sequentially further comprises providing a plurality of dielectric layers, wherein the providing facilitates minimizing the layering effect between the plurality of dielectric layers, and creating substantially planar defect-free interlayer structure of the plurality of dielectric layers.

* * * * *